(12) United States Patent
Teh et al.

(10) Patent No.: US 10,083,936 B2
(45) Date of Patent: Sep. 25, 2018

(54) SEMICONDUCTOR PACKAGE HAVING SPACER LAYER

(71) Applicant: INTEL CORPORATION, Santa Clara, CA (US)

(72) Inventors: Weng Hong Teh, Phoenix, AZ (US); John S. Guzek, Chandler, AZ (US); Shan Zhong, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/289,058

(22) Filed: Oct. 7, 2016

(65) Prior Publication Data

US 2017/0025392 A1 Jan. 26, 2017

Related U.S. Application Data

(62) Division of application No. 13/977,183, filed as application No. PCT/US2011/058598 on Oct. 31, 2011, now Pat. No. 9,490,196.

(51) Int. Cl.
*H01L 25/065* (2006.01)
*H01L 23/12* (2006.01)
(Continued)

(52) U.S. Cl.
CPC .......... *H01L 25/0657* (2013.01); *H01L 23/12* (2013.01); *H01L 23/13* (2013.01); *H01L 23/3128* (2013.01); *H01L 23/498* (2013.01); *H01L 23/49822* (2013.01); *H01L 23/49827* (2013.01); *H01L 23/49838* (2013.01);
(Continued)

(58) Field of Classification Search
CPC ..... H01L 25/0657; H01L 23/12; H01L 23/13; H01L 23/5389; H01L 23/49827; H01L 23/49822; H01L 23/49838
See application file for complete search history.

(56) References Cited

U.S. PATENT DOCUMENTS 7,042,077 B2 5/2006 Walk
7,309,923 B2 12/2007 Kee
(Continued)

FOREIGN PATENT DOCUMENTS

CN 1830084 A 9/2006
CN 101904002 A 12/2010
(Continued)

OTHER PUBLICATIONS

Notice of Second Office Action (3 pages) from the China State Intellectual Property Office dated Nov. 17, 2016 for Chinese Patent Application No. 201180074549.X.
(Continued)

*Primary Examiner* — Fei Fei Yeung Lopez
(74) *Attorney, Agent, or Firm* — Schwabe, Williamson & Wyatt, P.C.

(57) ABSTRACT

Package assemblies for and methods of packaging integrated circuit chips are described. Disclosed package assemblies have spacers and recessed regions comprising IC chips. Architectural structures are provided that enable, for example, three dimensional (3D) packaging (or system in package (SiP) or multi-chip modules), systems-on-chip 3D packaging, and hybrid 3D bonding. Embodiments of the invention can be used, for example, to create logic-to-memory, memory-to-memory, and logic-to-logic interface stacking assemblies.

7 Claims, 12 Drawing Sheets

(51) Int. Cl.
*H01L 23/498* (2006.01)
*H01L 23/13* (2006.01)
*H01L 25/10* (2006.01)
*H01L 23/538* (2006.01)
*H01L 23/31* (2006.01)

(52) U.S. Cl.
CPC .... *H01L 23/49894* (2013.01); *H01L 23/5389* (2013.01); *H01L 25/105* (2013.01); *H01L 23/3121* (2013.01); *H01L 23/49816* (2013.01); *H01L 2224/13147* (2013.01); *H01L 2224/14181* (2013.01); *H01L 2224/16225* (2013.01); *H01L 2224/16227* (2013.01); *H01L 2224/73* (2013.01); *H01L 2225/06513* (2013.01); *H01L 2225/06548* (2013.01); *H01L 2225/06555* (2013.01); *H01L 2225/06575* (2013.01); *H01L 2924/1461* (2013.01)

(56) References Cited

U.S. PATENT DOCUMENTS

| | | | |
|---|---|---|---|
| 7,923,830 | B2 | 4/2011 | Pope et al. |
| 8,035,218 | B2 | 10/2011 | Guzek |
| 8,093,704 | B2 | 1/2012 | Palmer |
| 8,313,958 | B2 | 11/2012 | Swaminathan |
| 8,513,792 | B2 | 8/2013 | Ganesan |
| 8,535,989 | B2 | 9/2013 | Sankman |
| 8,618,652 | B2 | 12/2013 | Nalla |
| 8,742,561 | B2 | 6/2014 | Guzek |
| 8,786,066 | B2 | 7/2014 | Guzek |
| 2009/0072382 | A1 | 3/2009 | Guzek |
| 2010/0224974 | A1 | 9/2010 | Shim et al. |
| 2011/0101491 | A1 | 5/2011 | Skeete |
| 2011/0215464 | A1 | 9/2011 | Guzek |
| 2011/0228464 | A1 | 9/2011 | Guzek |
| 2011/0316140 | A1 | 12/2011 | Nalla et al. |
| 2011/0318850 | A1 | 12/2011 | Guzek |
| 2012/0112336 | A1 | 5/2012 | Guzek |
| 2012/0326271 | A1 | 12/2012 | Teh |
| 2013/0075924 | A1 | 3/2013 | Lin et al. |
| 2013/0292838 | A1 | 11/2013 | Ganesan |
| 2013/0328207 | A1 | 12/2013 | Sankman |

FOREIGN PATENT DOCUMENTS

| | | |
|---|---|---|
| JP | 10-242380 A | 9/1998 |
| JP | 2007-714441 | 8/2007 |
| KR | 10-2001-0028992 A | 4/2001 |
| KR | 2001-0028992 A | 4/2001 |
| KR | 10-2008-0020372 A | 3/2008 |

OTHER PUBLICATIONS

International Preliminary Report on Patentability received for International Application No. PCT/US2011/058598, dated May 15, 2014, 6 pages.
International Search Report and Written Opinion received for International Application No. PCT/US2011/058598, dated Mar. 28, 2012, 9 pages.
Notice of Preliminary Rejection (Final) from the Korean Intellectual Property Office (KIPO) dated Feb. 5, 2016 for Korean Patent Application No. 10-2014-7010683 and English Summary thereof.
Notice of First Office Action from the China State Intellectual Property Office dated Apr. 1, 2016 for Chinese Patent Application No. 201180074549.X.

SEMICONDUCTOR PACKAGE HAVING SPACER LAYER

This is a Divisional of application Ser. No. 13/977,183 filed Jun. 28, 2013 which is a U.S. National Phase Application under 35 U.S.C. 371 of International Application No. PCT/US2011/058598 filed Oct. 31, 2011.

BACKGROUND OF THE INVENTION

Field of the Invention

The embodiments of the invention relate generally packages for semiconductor devices, coreless packages, methods for semiconductor packaging, and three dimensional stacking of semiconductor devices.

Background Information

Integrated circuit (IC) chip performance, power management, and size improvements place increasing demands on the materials and techniques used for packaging and assembly of the resultant IC chips. In general, an integrated circuit chip is also known as a microchip, a silicon chip, a semiconductor chip, or a chip. IC chips are found in a variety of common devices, such as the microprocessors in computers, cars, televisions, CD players, smart phones, and cellular phones. A plurality of IC chips can be built on a semiconductor wafer (a thin silicon disk, having a diameter, for example, of 300 mm) and after processing the wafer is diced apart to create individual IC chips (or dies). After manufacture, the IC chip is typically packaged in a manner which takes into account the operating environment provided by the device in which the IC chip will reside. In general, the package for the IC chip protects the chip from damage and supplies electronic connections that connect the IC chip to power supplies and other electronic components (performing, for example, input/output functions). As semiconductor chips trend toward higher bandwidth performance and users desire smaller form factors, the packaging of the semiconductor chips must meet size, thermal management, power delivery, interconnect density, and integration challenges.

DETAILED DESCRIPTION OF THE INVENTION

Embodiments of the present invention provide package structures for and methods of packaging integrated circuit chips. Package assemblies having spacers and recessed regions comprising IC chips are provided. Different architectural structures are provided that enable, for example, three dimensional (3D) packaging (or system in package (SiP) or multi-chip modules), systems-on-chip 3D packaging, and hybrid 3D bonding. Embodiments of the invention can be used, for example, to create logic-to-memory, memory-to-memory, and logic-to-logic interface stacking assemblies. Embodiments of the invention enable, for example, 3D through silicon via (TSV) packaging techniques and provide low z-height form factor packages while providing a high degree of 3D system integration.

Figure 1A:
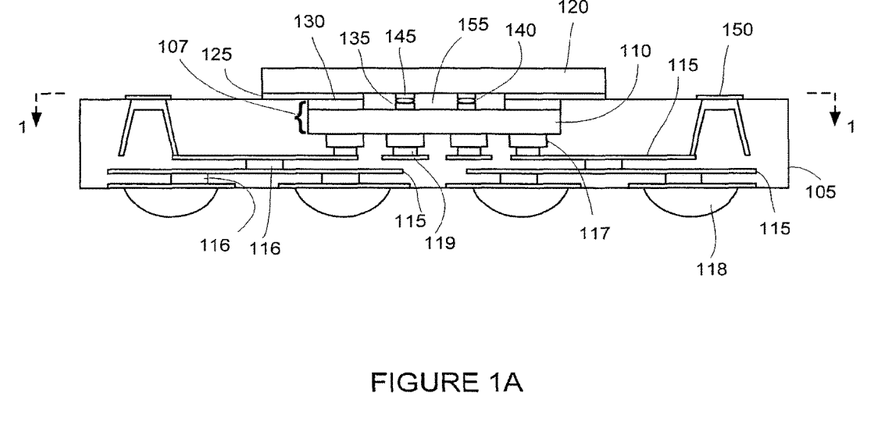
FIGS. 1A-B are a schematic diagrams illustrating cross-sectional views of a multi IC chip package structure.
Figure 1B:
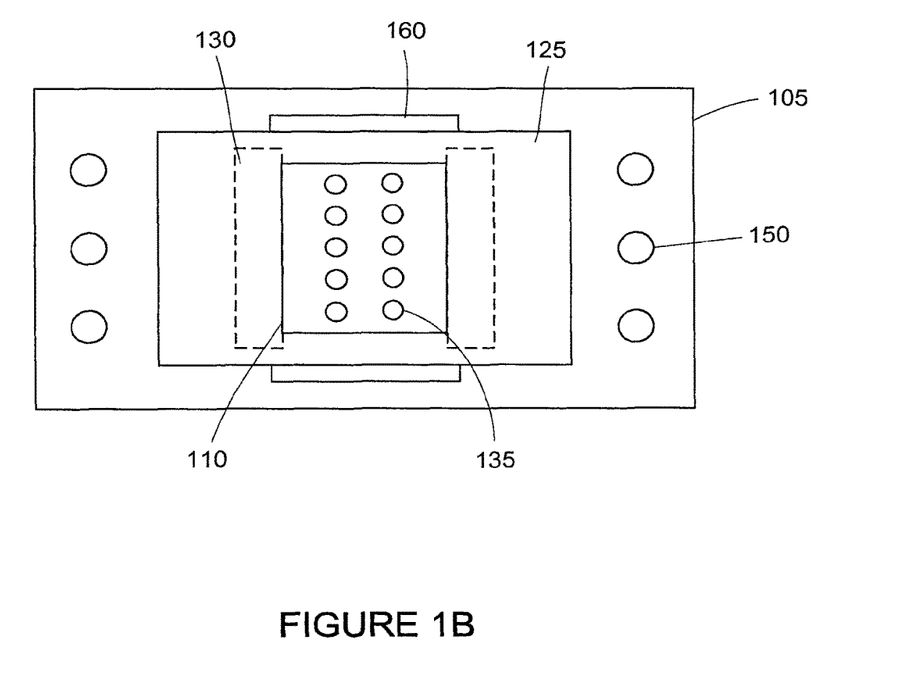

FIGS. 1A-B are diagrams of a package structure having integrated 3D stacked IC chips (or dies). FIG. 1B is a view along 1-1 of FIG. 1A. In FIG. 1A, the package structure is comprised of a package substrate 105 that has a recess 107 in which a first IC die 110 is housed. The first IC die 110 is recessed within the package substrate 105. In embodiments of the invention, the substrate 105 is coreless substrate and or a bumpless build up layer (BBUL) substrate and comprises conducting lines (trenches) 115 and or vias 116. Other substrate 105 designs are possible for a package substrate 105 comprising conducting lines 115 and or vias 116, such as substrates that comprise cores. Conducting regions 117 electrically connect the IC die 110 to the conducting lines 115 and vias 116 of the package substrate 105. Conducting regions 117, are for example, copper bumps. The conducting lines 115 and vias 116 are shown in a simplified pattern for illustration purposes and other designs and patterns for conducting lines 115 and vias 116 are also possible. External package electrical connectors 118 provide an interface between the packaged IC dies 110 and 120 and the device within which the package structure of FIG. 1A is capable of being housed. The external package electrical connectors 118 are, for example, copper bumps, solder ball grid arrays, or solder bumps. Vias 119 connect the conducting regions 117 of the IC die 110 to the package substrate 105.

A second IC die 120 is bonded to the package substrate 105 through bonding region 125. Bonding region 125 has a larger area than typical 3D packaging bonding schemes due to a backside spacer 130 that is on a surface of the first IC die 110. In embodiments of the invention, bonding region 125 is capable of acting as a bonding stop layer when the second IC die 120 is bonded to the package structure during manufacture. The second IC die 120 can be a plurality of IC dies. The backside spacer 130 is, for example, a die backside film (dbf) comprised of a dielectric film, such as, for example, a polymer/inorganic composite, silicon dioxide, silicon nitride, a passivation layer, a spin-on glass, a ceramic thin film, and or Ajinomoto build-up film (ABF) (commercially available from Ajinomoto Fine-Techno Co, Inc., Fort Lee, N.J., USA). Advantages of the backside spacer 130 include improved ease of manufacture of 3D structures, through improved bonding joint control through providing a joint stop layer. The bonding region 125 is comprised, for example, of an adhesive such as an epoxy film with or without filler particles, a thin metal region, a thin region comprised of silicon, silicon dioxide, or silicon nitride that provide adhesive bonding, underfills, no flow underfills, and or other adhesive materials. IC die interconnects 135 on the first IC die 110 are bonded through bonding region 140 to IC die interconnects 145 on the second IC die 120 and form and electrical connection through bonding region 140. IC die interconnects 135 and 145 are associated, for example, with through silicon via (TSV) regions of the IC dies 110 and 120. IC die interconnects 135 and 145 can be conducting pads, bumps, pillars, columns, pins, or other structures. Bonding region 140 is, for example, a copper-copper bonded region, solder, thermal compression bonding solder, a region where die electrical interconnects 135 and 145 are in electrical contact with each other (without being bonded to each other), or a reflowed solder joint. Optional external vias 150 allow electrical connections to be formed, for example, between IC dies.

An optional underfill layer 155 fills the space between the first IC die 110 and the second IC die 120. The underfill layer 155 can comprise, for example, an epoxy with or without filler particles, or a polymer or inorganic material with or without filler particles. Referring to FIG. 1B, optional access regions 160 are provided that allow an underfill layer 155 (FIG. 1A) to be added to the package structure after the first IC die 110 is bonded to the second IC die 120. In FIG. 1B, an underfill layer 155 has been omitted for clarity of illustration and backside spacer 130 beneath bonding region 125 is shown with dashed lines. Backside spacer 130 can be different sizes depending on factors such as ease of processing, amount of assisted mechanical bonding needed between components, IC die form factor, and or z-height needed for a bonding stop layer. Only part of the surface of the first IC chip 110 is seen in FIG. 1B. In general, an underfill layer can protect components and interconnect regions from ambient conditions, provide additional adhesion between components, and protect the package structure from failure due to thermally or mechanically induced stresses.

Electrical interconnects including lines 115 and or vias 116, conducting regions 117, external package electrical connectors 118, and vias 119, comprise a conducting material, such as, for example, copper or aluminum, although other conducting materials are also possible. Electrical connectivity pads 135 and 145 comprise a conducting material, such as, for example, a metal such as copper, aluminum, silver, gold, tungsten, platinum, or mixtures thereof. In an embodiment of the invention, one or more of the electrical interconnects comprise copper.

Figure 2A:
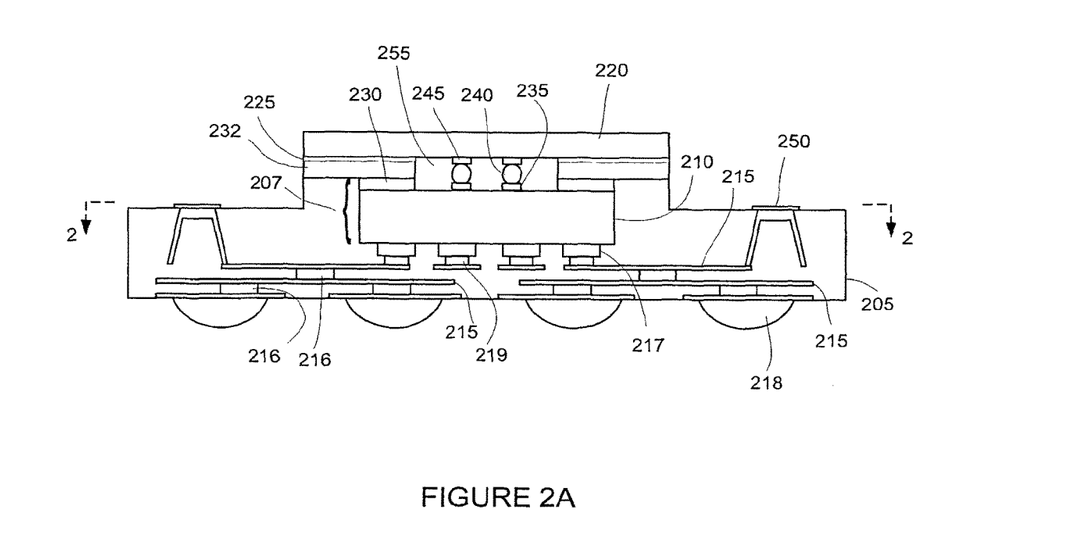
FIGS. 2A-B illustrate cross-sectional views of an additional package structure comprising IC chips
Figure 2B:
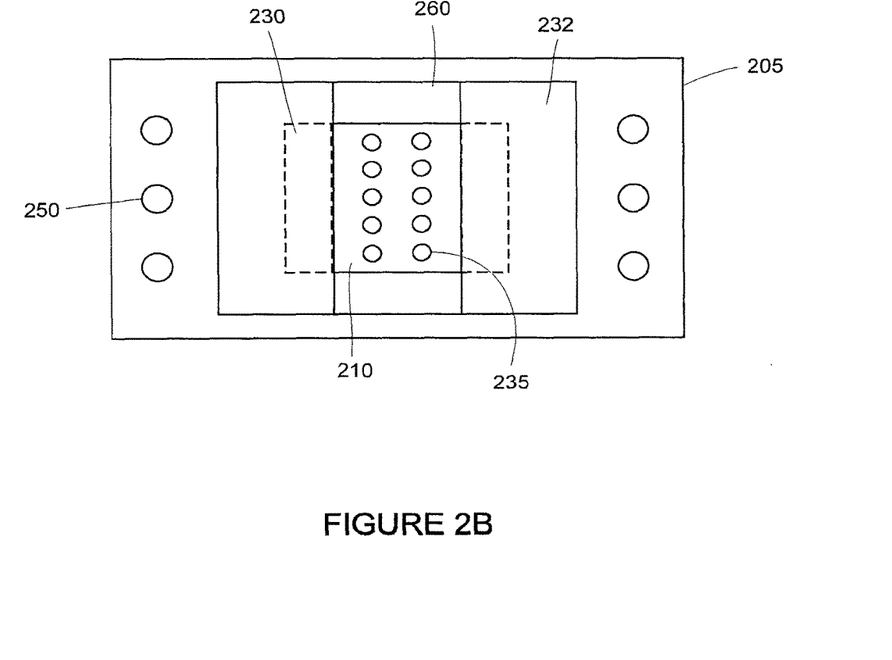

FIGS. 2A-B provide diagrams of an additional package structure having integrated 3D stacked IC chips (or dies). FIG. 2B is a view along 2-2 of FIG. 2A. In FIG. 2A, the package structure is comprised of a package substrate 205 that has a recess 207 in which a first IC die 210 is housed. The first IC die 210 is recessed within the package substrate 205 and can be either fully or partially embedded in the package substrate 205. In embodiments of the invention, the substrate 205 is coreless substrate and or a bumpless build up layer (BBUL) substrate and comprises conducting lines (trenches) 215 and or vias 216. Other substrate 205 designs are possible for a package substrate 205 comprising conducting lines 215 and or vias 216, including, for example, substrates having a core. Conducting regions 217 electrically connect the IC die 210 to the conducting lines 215 and vias 216 of the package substrate 205. Conducting regions 217, are for example, copper bumps. The conducting lines 215 and vias 216 are shown in a simplified pattern for illustration purposes and other designs and patterns for conducting lines 215 and vias 216 are also possible. External package electrical connectors 218 provide an interface between the packaged IC dies 210 and 220 and the device within which the package structure of FIG. 2A is capable of being be housed. The external package electrical connectors 218 are, for example, copper bumps. Vias 219 connect the conducting regions 217 of the IC die 210 to the package substrate 205

A second IC die 220 is bonded to the package structure though bonding region 225. Bonding region 225 has a larger area than typical 3D packaging bonding schemes due to a backside spacer 230 that is on a surface of the first IC die 210 and raised spacer 232. The second IC die 220 can be a plurality of IC dies. The backside spacer 230 is, for example, a die backside film (dbf) comprised of, a dielectric film, such as, for example, a polymer/inorganic composite, silicon dioxide, silicon nitride, a passivation layer, a spin-on glass, a dry film photoresist (DFR), a ceramic thin film, and or Ajinomoto build-up film (ABF). The raised spacer 232 is comprised of a material, such as, for example, silicon nitride, silicon dioxide, a dry film photoresist, and or ABF. Advantages of the backside spacer 230 and dielectric layer 232 include improved ease of manufacture of 3D structures through improved bonding joint control through providing a joint stop layer. The bonding region 225 is comprised, for example, of an adhesive, such as, epoxy film with or without filler particles, a thin metal region, a thin region comprised of silicon, silicon dioxide, or silicon nitride, underfills, no flow underfills, and or other adhesive materials. IC die interconnects 235 on the first IC die 210 are bonded through bonding region 240 to IC die interconnects 245 on the second IC die 220 and form and electrical connection through bonding region 240. IC die interconnects 235 and 245 are associated, for example, with through silicon via (TSV) regions of the IC dies 210 and 220. IC die interconnects 235 and 245 can be conducting pads, bumps, pillars, columns, or other structures. Bonding region 240 is, for example, a copper-copper bonded region, solder, thermal compression bonding solder, or a region where die electrical interconnects 235 and 245 are in electrical contact with each other (without bonding), or a reflowed solder joint. Optional external vias 250 allow electrical connections to be formed, for example, between IC dies.

An optional underfill layer 255 fills the space between the first IC die 210 and the second IC die 220. The underfill layer 255 can comprise a flowable dielectric material, such as, for example, an epoxy with or without filler particles, or a polymer or inorganic material with or without filler particles. Referring to FIG. 2B, optional access regions 260 are provided that allow an underfill layer 255 (FIG. 2A) to be added to the package structure after the first IC die 210 is bonded to the second IC die 220. Access regions 260 are recessed regions in raised spacer 232. In FIG. 2B, an underfill layer 255 has been omitted for illustration purposes and backside spacer 230 beneath raised spacer 232 is shown with dashed lines. Backside spacer 230 can be different sizes depending on factors such as ease of processing, amount of assisted mechanical bonding needed between components, IC die form factor, and or z-height needed for a bonding stop layer. Only part of the surface of the first IC chip 210 is seen in FIG. 2B.

Electrical interconnects including lines 215 and or vias 216, conducting regions 217, external package electrical connectors 218, and vias 219, comprise a conducting material, such as, for example, copper or aluminum, although other conducting materials are also possible. Electrical connectivity pads 235 and 245 comprise a conducting material, such as, for example, a metal such as copper, aluminum, silver, gold, tungsten, platinum, or mixtures thereof. In an embodiment of the invention, one or more of the electrical interconnects comprise copper.

Figure 3A:
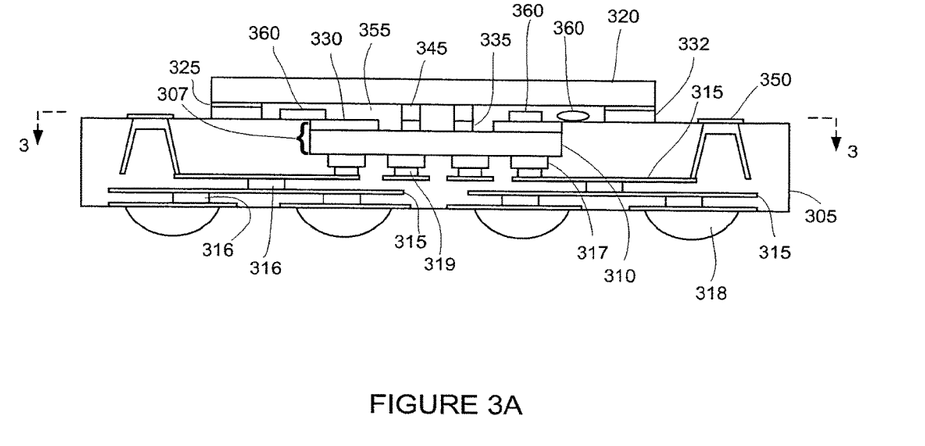
FIGS. 3A-B illustrate cross-sectional views of an additional package structure comprising IC chips.
Figure 3B:
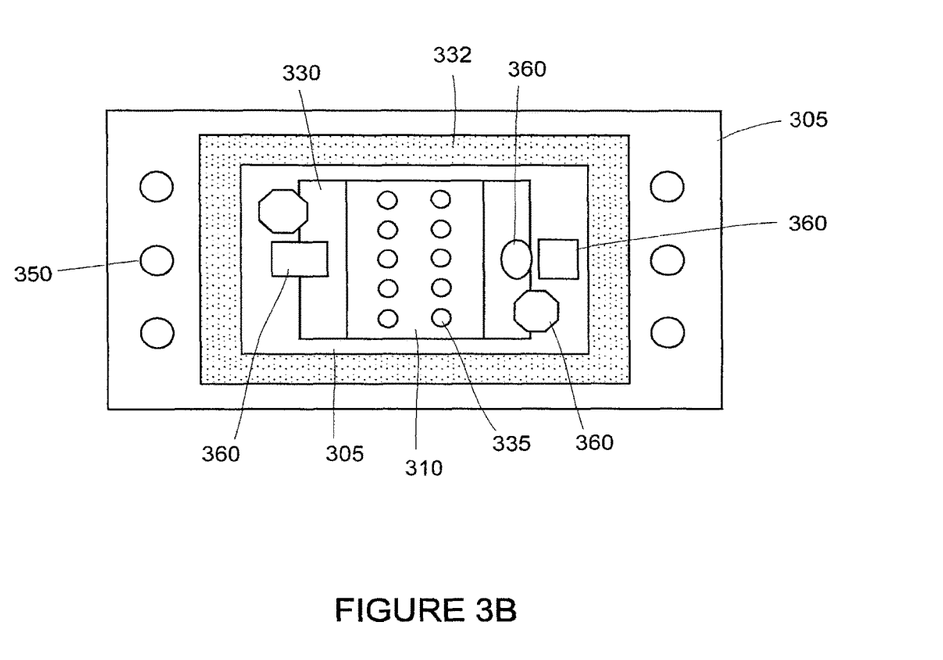

FIGS. 3A-B provide diagrams of an additional package structure having integrated 3D stacked IC chips (or dies). FIG. 3B is a view along 3-3 of FIG. 3A. In FIG. 3A, the package structure is comprised of a package substrate 305 that has a recess 307 in which a first IC die 310 is housed. The first IC die 310 is recessed within the package substrate 305 and can be either fully or partially embedded in the package substrate 305. The first IC die 310 is shown as fully embedded in FIG. 3A. In embodiments of the invention, the substrate 305 is coreless substrate and or a bumpless build up layer (BBUL) substrate and comprises conducting lines (trenches) 315 and or vias 316. Other substrate 305 designs are possible for a package substrate 305 comprising conducting lines 315 and or vias 316. Conducting regions 317 are on one side of the IC die 310 and electrically connect the IC die 310 to the conducting lines 315 and vias 316 of the package substrate 305. Conducting regions 317, are for example, copper bumps. The conducting lines 315 and vias 316 are shown in a simplified pattern for illustration purposes and other designs and patterns for conducting lines 315 and vias 316 are also possible. External package electrical connectors 318 provide an interface between the packaged IC dies 310 and 320 and the device within which the package structure of FIG. 3A is capable of being housed. The external package electrical connectors 318 are, for example, copper bumps or solder ball grid arrays. Vias 319 connect the conducting regions 317 of the IC die 310 to the package substrate 305.

A second IC die 320 is bonded to the package structure though bonding region 325. Bonding region 325 contacts a raised patterned dielectric layer 332 on a surface of the package substrate 305. The raised spacer 332 is comprised of a dielectric material, such as, for example, of silicon nitride, silicon dioxide, a dry film photoresist (DFR), and or ABF. The second IC die 320 can be a plurality of IC dies. The bonding region 325 is comprised, for example, of an adhesive material, such as, an epoxy film with or without filler particles, a thin metal region, a thin region comprised of silicon, silicon dioxide, or silicon nitride, underfills, no flow underfills, and or other adhesive materials. An backside spacer 330 is on a side of IC die 310 and is comprised of, for example, a die backside film (dbf) comprised of a polymer/inorganic composite, a dielectric film, such as, for example, $SiO_2$ and or silicon nitride, a passivation layer, a spin-on glass, and or a ceramic thin film. In general, backside spacer 330 can be different sizes depending on factors such as ease of processing, amount of assisted mechanical bonding needed between components, IC die form factor, and or z-height needed for a bonding stop layer. In alternate embodiments, backside spacer 330 is not present in the structure. IC die interconnects 335 on the first IC die 310 are bonded to IC die interconnects 345 on the second IC die 320 and form and electrical connection through bonding region 340. IC die interconnects 335 and 345 are associated, for example, with through silicon via (TSV) regions of the IC dies 310 and 320. IC die interconnects 335 and 345 can be conducting pads, bumps, pillars, columns, or other structures. Bonding between IC die interconnects 335 and 345 is, for example, copper-copper bonding (for example, thermal compression bonding), solder, thermal compression bonding solder, a non-bonded electrical contact region, or a reflowed solder joint. Optional external vias 350 allow electrical connections to be formed, for example, between IC dies.

The raised spacer 332 on a surface of the package substrate 305 creates a cavity 355 between the first IC die 310 and the second IC die 320. Optionally, one or more devices 360 are located in the cavity 355. In embodiments of the invention, devices 360 are sensors and or actuators, such as for example, mems RF switches, cantilever-based sensors, accelerometers, gyroscopes, oscillators, pizeoresistive sensors, passives, RFID systems, antennas, and or GPS systems. Optionally, the cavity 355 comprises a gas, an inert gas, or other filler material. The cavity 355 is optionally a sealed region (having an airtight seal) having an inert, non-conducting, and or controlled atmosphere. Advantageously, the ability to provide an inert and or controlled atmosphere allows the integration of elements whose optimal capabilities and functions rely on a controlled ambient environment into a 3D package.

In FIG. 3B, a plurality of devices 360 are shown. In embodiments of the invention, there can be as few as zero devices, one device, two devices, three devices, etc. Electrical connections (not shown) for devices 360 are provided through package substrate 305. Only part of the surface of the first IC chip 310 is seen in FIG. 3B. In alternate embodiments, the package structure comprises access regions (not shown) similar to the optional access regions 160 and 260 of FIGS. 1B and 2B, respectively. An optional underfill layer can be flowed into cavity 355 through, for example, optional access regions (not shown). Similarly, an inert atmosphere can be injected into cavity 355 and optional access regions sealed to enclose cavity 355.

Electrical interconnects including lines 315 and or vias 316, conducting regions 317, external package electrical connectors 318, and vias 319, comprise a conducting material, such as, for example, copper or aluminum, although other conducting materials are also possible. Electrical connectivity pads 335 and 345 comprise a conducting material, such as, for example, a metal such as copper, aluminum, silver, gold, tungsten, platinum, or mixtures thereof. In an embodiment of the invention, one or more of the conducting regions comprise copper.

In alternate embodiments, no devices 360 are present and or the backside spacer 330 is not present. In additional alternate embodiments, the raised spacer 332 can be located within the shadow of the first IC die 310 and on the surface of the first IC die 310. An embodiment in which the raised spacer 332 is located within the shadow of a first IC die (and on the surface of a first IC die) is depicted in FIG. 4E(iv). In further additional alternate embodiments, the raised spacer 332 can be located both on the surface of the first IC die 310 and the surface of the substrate 305. An embodiment in which a raised spacer is located both on the surface of a first IC die and the surface of the substrate is shown in FIG. 4C(v).

In general and with respect to any of the embodiments herein, the first IC die can be smaller or larger with respect to any dimensions that the second IC die. The location(s) of backside spacers can be adjusted accordingly.

Figure 4A:
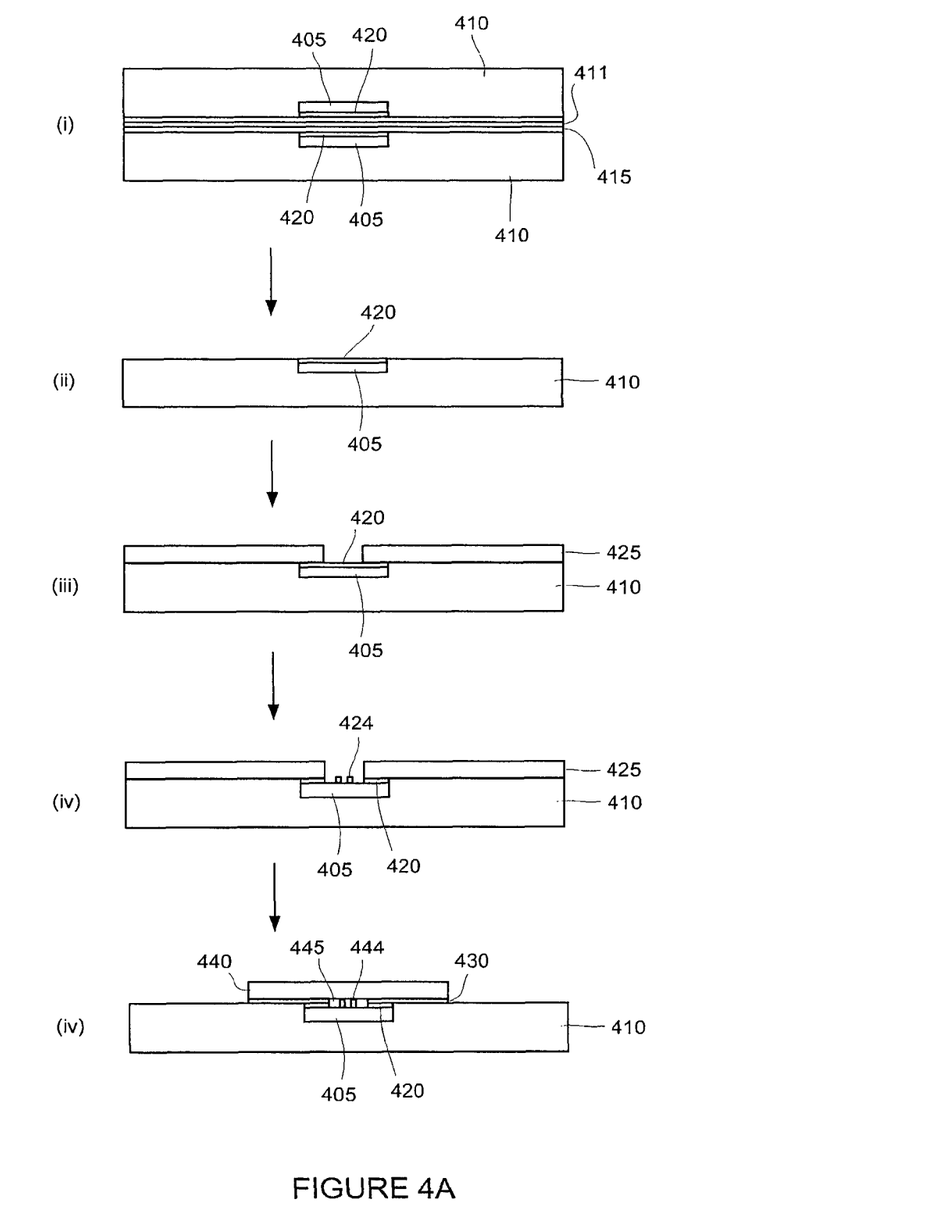
FIGS. 4A-E illustrate methods of making multi IC chip package structures.

FIGS. 4A-E describe methods of making package structures according to embodiments of the invention. Other methods are, of course, possible. In FIG. 4A, a build-up layer process has been used to from structure (i)/A. Structure (i)/A comprises two first IC dies 405 embedded in package substrates 410. Lines and vias in package substrates 410 are present but not depicted. The two panels (comprising package substrates 410 and first IC dies 405) are separated (at separation layer 411) and the build substrate 415 on which the package substrate 410 is built is removed yielding structure (ii)/A (which is one half of structure (i)/A). The first IC die 405 comprises a dielectric backside spacer 420, such as a die backside film, on a surface. The backside spacer 420 is, for example, a die backside film (dbf) comprised of a polymer/inorganic composite, a dielectric film, such as, for example, silicon dioxide and or silicon nitride, a passivation layer, a spin-on glass, and or a ceramic thin film A photoresist layer 425 (or DFR) is deposited onto a surface of the package substrate 410 and patterned yielding structure (iii)/A. The dielectric layer 420 on the IC die 405 is etched where it is exposed, by, for example a plasma ash process or a solvent-based removal process, exposing IC die interconnects 424 yielding structure (iv)/A. A solvent-based removal procedure can be used, for example, with an acrylic based DBF and PGMEA (2-(1-methoxyl)propyl acetate) or TMAH (tetramethylammonium hydroxide) as solvent. The amount of dielectric layer 420 that remaining on the IC die 405 is optional after enough is removed to expose IC die interconnects 424 and values chosen can depend on considerations such as ease of processing, amount of assisted mechanical bonding needed, and or the z-height needed for a bonding stop layer. Structure (iv)/A can then be used to make the 3D stacked package structure (v)/A by removing photoresist layer 425, selectively depositing optional adhesive 430, and bonding the interconnects of the first IC die 405 and the second IC die 440 together creating interconnect region 444. In alternate embodiments a bond between the second IC die 440 and the package substrate 410/dielectric layer 420 can be a Si—Si, SiO$_2$—SiO$_2$, or SiN—SiN bond. This Si—Si, SiO$_2$—SiO$_2$, or SiN—SiN bond can be formed through a fusion bonding process in which a layer of material that forms the bond is present on both surfaces to be bonded. The interconnect bond between the first IC die 405 and the second IC die 440 (in the interconnect region 444) is formed by, for example, thermal compression bonding or constrained reflow. An optional underfill layer can then be flowed into cavity 445.

Figure 4B:
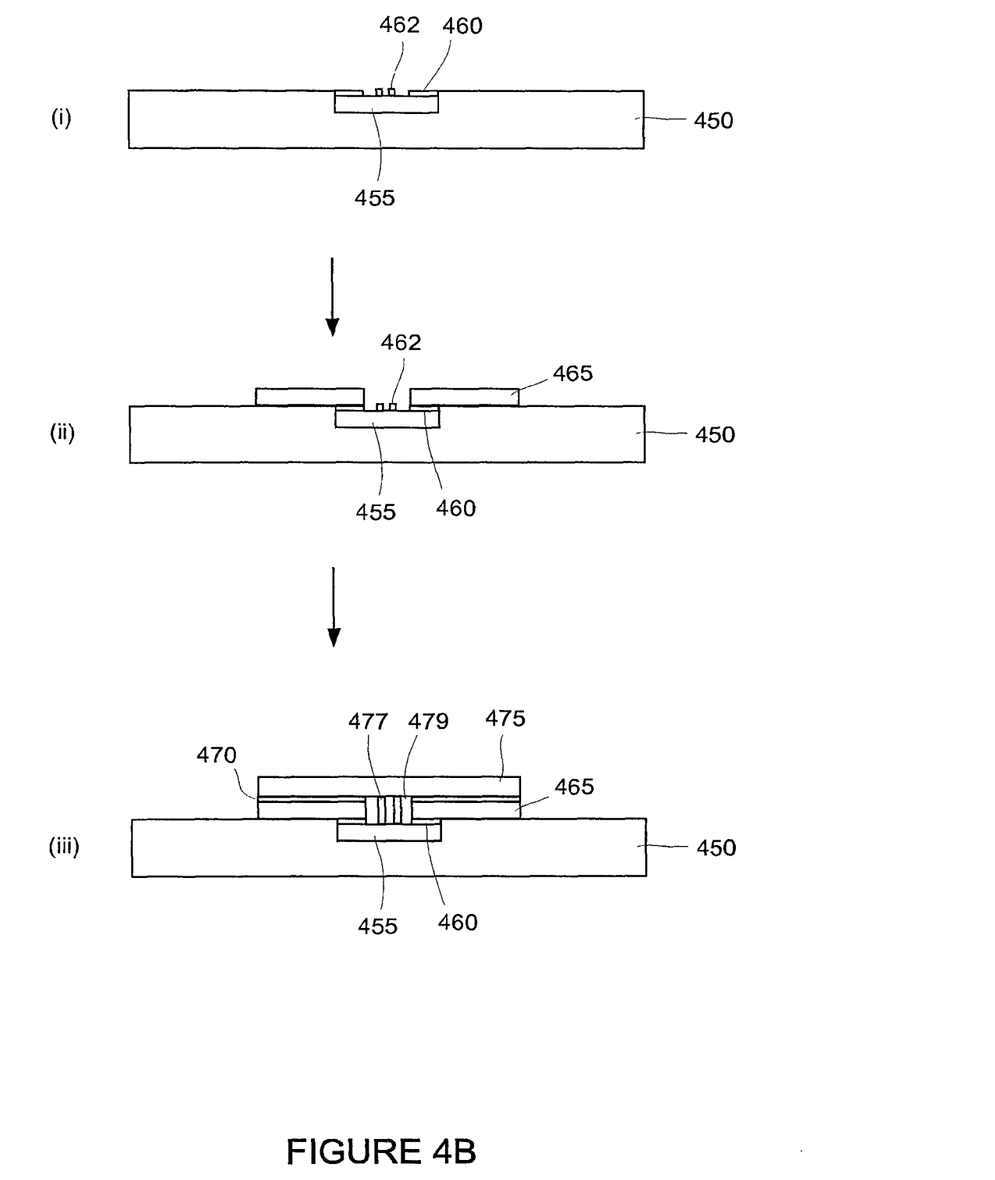
Figure 4C:
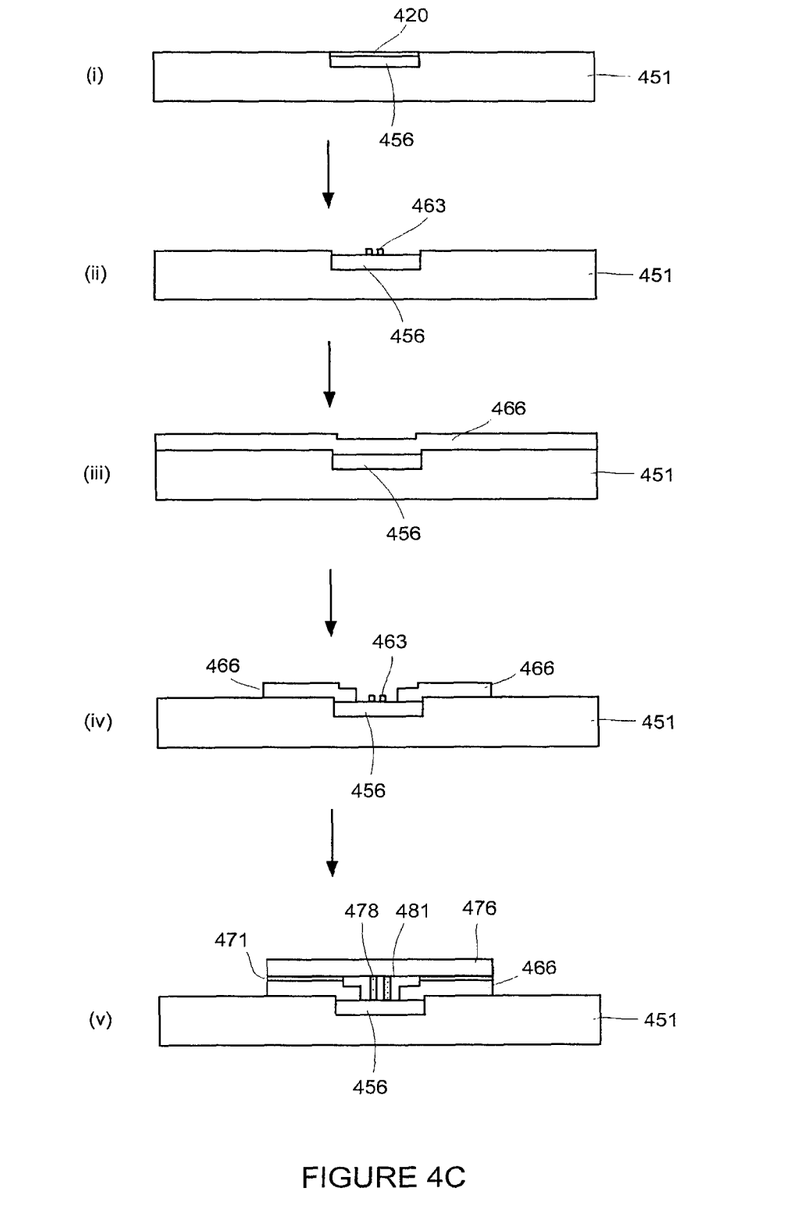

In FIG. 4B, structure (i)/B is made, for example, using the method of FIG. 4A structures(i)-(iv) including removing the patterned photoresist layer 425. In structure (i)/B, the package substrate 450 houses a first IC die 455 which has a dielectric layer 460, such as a die backside film, on a surface. The dielectric layer 460 on a surface, is partially removed exposing first IC die interconnects 462. Raised spacer 465 is formed on a surface of the package substrate 450 and the dielectric layer 460 yielding structure (ii)/B. Raised spacer 465 can be formed, for example, by pick and place, physical or chemical deposition, dispense and cure techniques. Structure (iii)/B can then be used to make the 3D stacked package structure (iv)/B by selectively depositing optional adhesive 470 on structure (iii)/B and bonding the interconnects of the first IC die 455 and the second IC die 475 together creating interconnect region 477. In alternate embodiments a bond between the second IC die 475 and the raised spacer 465 can be a Si—Si, SiO$_2$—SiO$_2$, or SiN—SiN bond. This Si—Si, SiO$_2$—SiO$_2$, or SiN—SiN bond can be formed through a fusion bonding process in which a layer of material that forms the bond is present on both surfaces to be bonded. The interconnect bond between the first IC die 455 and the second IC die 475 (in the interconnect region 477) is formed by, for example, thermal compression bonding or constrained reflow. An optional underfill layer can then be flowed into cavity 479.

FIG. 4C structure (i)/C is made, for example, using the method of FIG. 4A structures(i)-(ii). In structure (i)/C, the package substrate 451 houses a first IC die 456. The first IC die 456 comprises a dielectric layer 420, such as a die backside film, on a surface. Dielectric layer 420 is removed by, for example, using a solvent yielding structure (ii)/C. A raised spacer 466 is deposited yielding structure (iii)/C. The raised spacer 466 is comprised of a material, such as, for example, silicon nitride, silicon dioxide, a dry film photoresist (DFR), and or Ajinomoto build-up film (ABF) (commercially available from Ajinomoto Fine-Techno Co, Inc., Fort Lee, N.J., USA). The raised spacer 466 is selectively etched yielding structure (iv)/C. The IC die electrical interconnects 463 are again exposed. Structure (iv)/C can then be used to make the 3D stacked package structure (v)/C by selectively depositing optional adhesive 471 on structure (iii)/C and bonding the interconnects of the first IC die 456 and the second IC die 476 together creating interconnect region 478. In alternate embodiments a bond between the second IC die 476 and the raised spacer 466 can be a Si—Si, SiO$_2$—SiO$_2$, or SiN—SiN bond. This Si—Si, SiO$_2$—SiO$_2$, or SiN—SiN bond can be formed through a fusion bonding process in which a layer of material that forms the bond is present on both surfaces to be bonded. The interconnect bond between the first IC die 456 and the second IC die 476 (in the interconnect region 478) is formed by, for example, thermal compression bonding or constrained reflow. An optional underfill layer can then be flowed into cavity 481.

Figure 4D:
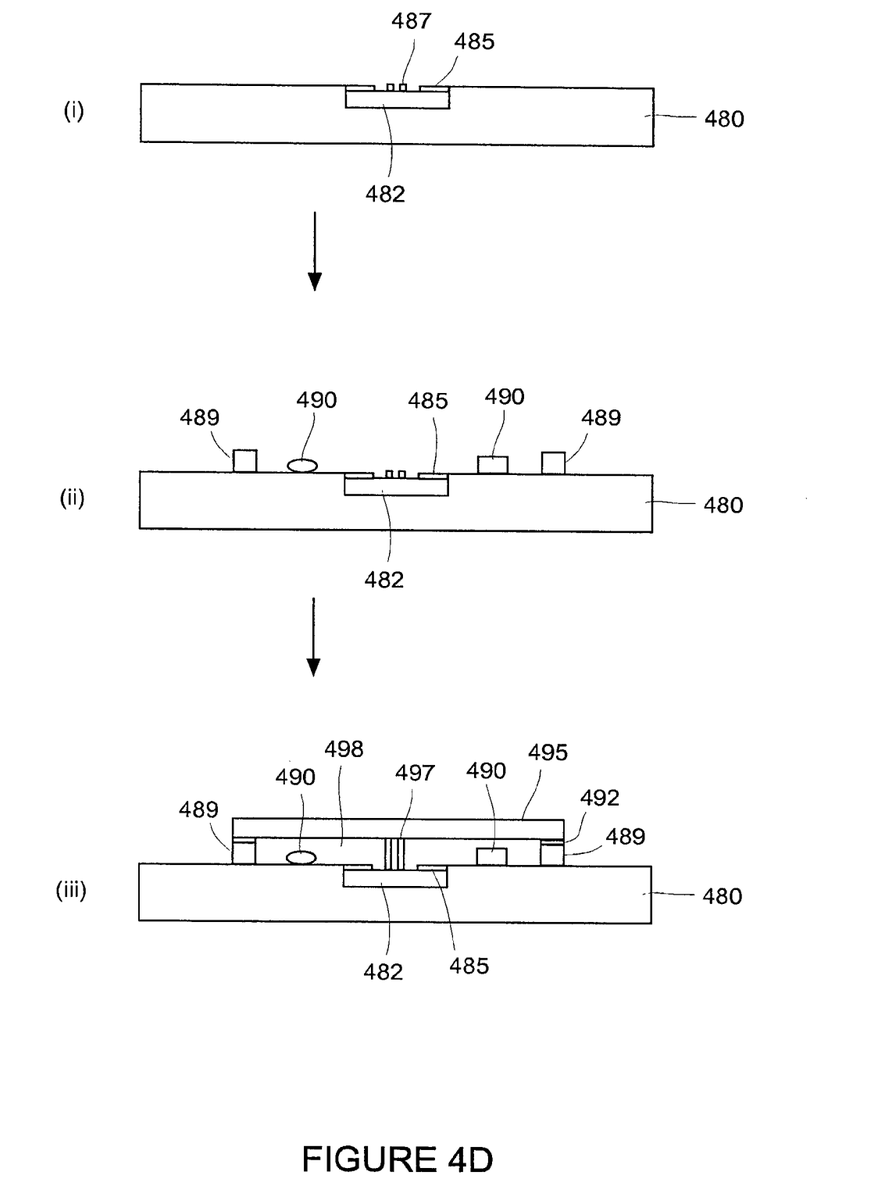
Figure 4E:
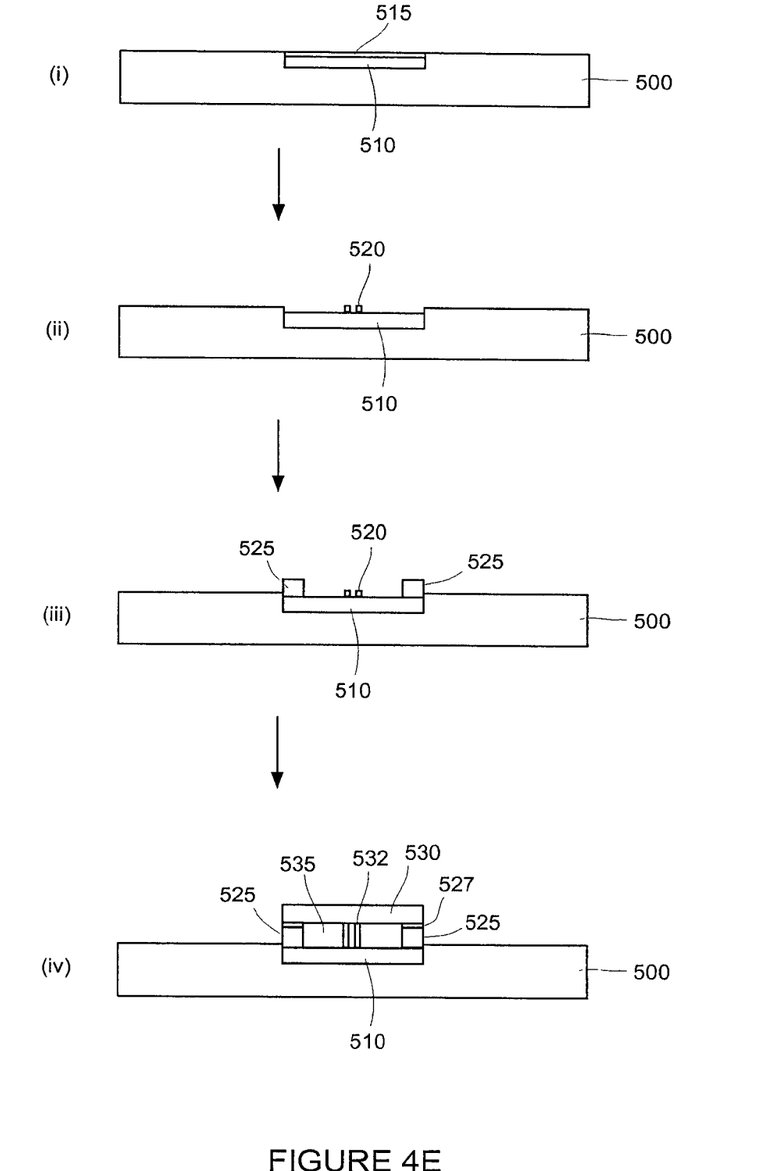

In FIG. 4D, structure (i)/D is made, for example, using the method of FIG. 4A structures(i)-(iv) including removing the patterned photoresist layer 425. In structure (i)/D, the package substrate 480 houses a first IC die 482 which has a dielectric layer 485, such as a die backside film, on a surface. The dielectric layer 485 on a surface, is partially removed exposing first IC die interconnects 487. Raised patterned raised layer 489 is formed on a surface of the package substrate 480 yielding structure (ii)/D. Raised spacer 489 can be formed, for example, by a pick and place process whereby a pre-formed region is adhered with an epoxy to the package substrate 480, a selective epoxy deposition process in which the raised spacer 489 is formed of epoxy, dispensing spacer particles, or dispensing an organic polymer (such as a UV curable ink). Optionally, one or more devices 490 are placed within the cavity 498 and electrical interconnections formed with the package substrate 480. Devices 490 can be sensors and or actuators, such as for example, mems RF switches, cantilever-based sensors, accelerometers, gyroscopes, oscillators, pizeoresistive sensors, passives, RFID systems, antennas, and or GPS systems. Structure (iii)/D is formed by selectively depositing optional adhesive 492 on raised spacer 489, attaching a second IC chip 495, and bonding the interconnects of the first IC die 480 and the second IC die 495 together creating interconnect region 497. In alternate embodiments a bond between the second IC die 495 and the raised spacer 489 can be a Si—Si, SiO$_2$—SiO$_2$, or SiN—SiN bond. This Si—Si, SiO$_2$—SiO$_2$, or SiN—SiN bond can be formed through a fusion bonding process in which a layer of material that forms the bond is present on both surfaces to be bonded. The interconnect bond between the first IC die 480 and the second IC die 495 (in the interconnect region 497) is formed by, for example, thermal compression bonding or a constrained reflow process. Optionally, the cavity 498 comprises a gas, an inert gas, or other filler material. The cavity 498 is optionally a sealed region having an inert and or controlled atmosphere. In alternate embodiments, an underfill layer can be flowed into cavity 498 through, for example the formation of microchannels leading into the sealed and 3D bonded structure or through regions such as optional access regions 160 and 260 of FIGS. 1B and 2B, respectively.

FIG. 4E structure (i)/E is made, for example, using the method of FIG. 4A structures(i)-(ii). In structure (i)/E, the package substrate 500 houses a first IC die 510. The first IC die 510 comprises a dielectric layer 515, such as a die backside film, on a surface. Dielectric layer 515 is removed by, for example, using a solvent or plasma ashing process yielding structure (ii)/E. After the dielectric layer 515 is removed, IC die interconnects 520 are exposed. A raised patterned dielectric layer 525 is deposited yielding structure (iii)/E. The raised spacer 525 is comprised of a dielectric material, such as, for example, of silicon nitride, silicon dioxide, a dry film photoresist (DFR), and or ABF. Raised patterned layer 525 can be formed, for example, by a pick and place process whereby a pre-formed region is adhered with an epoxy to the package substrate 500, a selective epoxy deposition process in which the raised patterned layer 525 is epoxy or formed by a process of dispensing spacer particles, or of dispensing an organic polymer (such as a UV curable ink). In this embodiment, raised patterned layer 525 is formed inside the shadow of the first IC die 510 which is recessed within the package substrate 500. In alternate embodiments, the raised patterned layer 525 can also be formed outside the shadow of the first IC die 510 on the proximate surface of the package substrate 500 or both on the surface of the first IC die 510 and the surface of the package substrate 500. In the embodiment shown in FIG. 4E, the first IC die 510 and the second IC die 530 are the same size, but in alternate embodiments the first IC die 510 has a larger footprint than the second IC die 530 or vice versa. Structure (iii)/E can then be used to make the 3D stacked package structure (iv)/E by, for example, selectively depositing optional adhesive 527 on structure (iii)/E and bonding the interconnects of the first IC die 510 and the second IC die 530 together creating interconnect region 532. The bond between the second IC die 530 and the raised patterned layer 525 can be formed by, for example, fusion bonding, adhesive bonding, direct bonding, or thermocompression bonding. In alternate embodiments a bond between the second IC die 495 and the raised spacer 489 can be a Si—Si, SiO$_2$—SiO$_2$, or SiN—SiN bond. This Si—Si, SiO$_2$—SiO$_2$, or SiN—SiN bond can be formed through a fusion bonding process in which a layer of material that forms the bond is present on both surfaces to be bonded. The interconnect bond between the first IC die 510 and the second IC die 530 (in the interconnect region 532) is formed by, for example, thermal compression bonding or constrained reflow. An optional underfill layer can then be flowed into cavity 535. The optional underfill layer can be flowed into cavity 535 through, for example the formation of microchannels leading into the sealed and 3D bonded structure or through regions such as optional access regions 160 and 260 of FIGS. 1B and 2B, respectively. In alternate embodiments, cavity 535 is filled with a gas or an inert gas and sealed to retain the gas or inert gas in the cavity 535.

In general, IC die interconnects can comprise any type of structure and materials that are capable of providing electrical communication between IC chips. According to embodiments of the invention, IC die interconnects can comprise reflowed solder bumps extending between a terminal (for example, a pad, bump, column, or pillar) on a surface of the first IC die and a mating terminal (for example, a pad, bump, column, or pillar) on a surface of the second IC die. Any suitable solder material may be used in embodiments of the invention. For example, the solder material may comprise tin, copper, silver, gold, lead, nickel, indium, as well as combination of these and/or other metals.

The IC dies discussed herein can be any type of integrated circuit device, such as, processors (single core or multi-core), logic chips, memory chips, analog chips, digital chips, graphics chips, and or MEMS. For example, the first die can be a processor and the second IC die can be a memory chip, a stacked memory/logic unit, or a plurality of stacked memory chips. Other exemplary chip combinations include microprocessors, graphics processors, signal processors, network processors, system-on-chip (SoC) having multiple functional units (such as, one or more processing units, graphics units, communications units, signal processing units, and or security units). A memory chip can be, for example, static random access memory (SRAM) chip, and or a dynamic random access memory (DRAM) chip, and or a non-volatile memory chip. In one embodiment, the package structures described herein are solid state drives. The relative sizes of the IC dies can be different that depicted herein, and the IC dies can be the same size, or the first IC die can be larger than the second or vice versa.

Package structures according to embodiments of the invention can comprise part of any type of computing system, such as, for example, a hand-held computing system (e.g., a cell phone, smart phone, or music player), a mobile computing system (e.g., a laptop, netbook, or tablet), a desktop computing system, or a server. A package structure can be mounted onto a mainboard assembly for integration into a computing system. In general, a mainboard may comprise any suitable type of circuit board or other substrate capable of providing electrical communication between one or more of the various components of the computing system disposed on the board and between the various components disposed on the board and other elements of the computing system.

Figure 5:
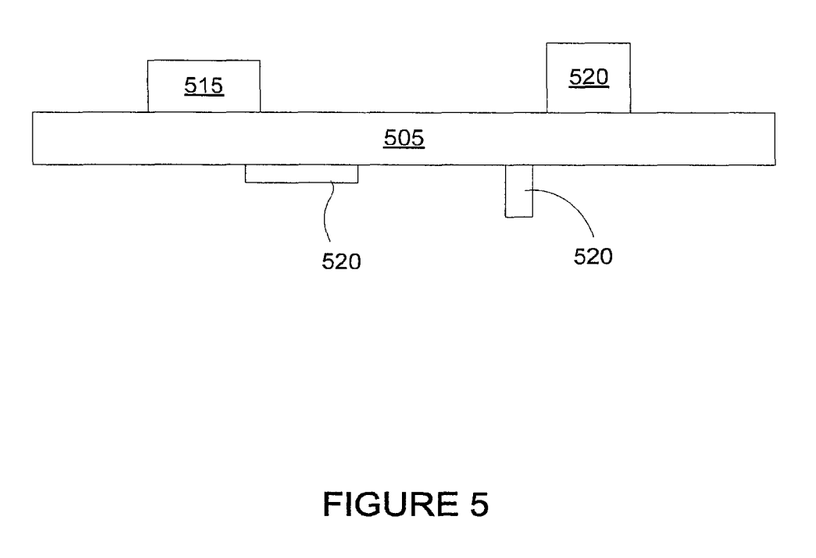
FIG. 5 shows a mainboard assembly comprising multi IC chip packages structures.

FIG. 5 provides a mainboard assembly, however other types of assembly structures are also possible. The mainboard assembly comprises a mainboard 505 having associated components that make up all or part of a computing system. In one embodiment, for example, the mainboard 505 is a printed circuit board (PCB) comprising multiple conductive lines separated from one another by a layer of dielectric material and interconnected by electrically conductive vias. Any one or more of the conductive lines and or vias may be formed in a desired circuit pattern to route electrical signals between the components coupled with the mainboard 505 and to provide input and output to one or more of the components coupled to the mainboard 505. However, mainboard 505 may comprise any other suitable substrate. A package structure 515, such as a structure described with respect to FIGS. 1-3 (A-B), is disposed on a first side of mainboard 505. One or more additional IC devices 520 are located on the first side or the second side of the mainboard 505. The additional IC devices 520 are, for example, processing devices, memory devices, signal processing devices, wireless communication devices, antennae, graphics controllers (or graphics drivers), input/output controllers, audio processors and or controllers, power delivery and or management components, such as, voltage regulator, power supplies, such as batteries, and or passive devices such as a capacitor, and or one or more user interface devices, such as, audio input devices, audio output devices, a keypad or other data entry device such as a touch screen display, and or a graphics display, as well as any combination of these and or other devices. The mainboard assembly can be disposed in a housing and or a case as part of a computing system. The computing system can additionally include, antennae, a cooling system, such as one or more fans and or heat sinks, user interface devices, such as keypads, touch pads, touch screens, and or audio input and or output devices, display screens, power supplies, such as batteries, and or other components listed with respect to the mainboard assembly, some or all of which are electrically coupled to the mainboard assembly.

Persons skilled in the relevant art appreciate that modifications and variations are possible throughout the disclosure as are substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, and characteristics disclosed in the embodiments may be combined in any suitable manner in one or more embodiments. Various additional layers and or structures may be included and or described features may be omitted in other embodiments.

We claim:

1. A device comprising:
   a packaging substrate having a surface wherein the surface has a recess formed therein;

a first integrated circuit die disposed in the recess of the packaging substrate wherein the first integrated circuit die has a surface;

a spacer layer disposed on the surface of the first integrated circuit die wherein the spacer layer has a first surface proximate to the first integrated circuit die and a second surface opposite to the first surface, wherein the spacer layer is in the recess;

a dielectric layer disposed on the surface of the packaging substrate and on the second surface of the spacer layer; and a second integrated circuit die disposed on the dielectric layer.

2. The device of claim 1 wherein the packaging substrate is a coreless packaging substrate.

3. The device of claim 1 wherein the packaging substrate is comprised of built-up layers of dielectric and conducting materials.

4. The device of claim 1 wherein the spacer layer is comprised of a dielectric material selected from the group consisting of a composite of a polymer and inorganic material, silicon dioxide, silicon nitride, spin-on glass, and ceramic.

5. A device comprising:

a mainboard assembly having a first side, wherein the mainboard assembly has a package assembly disposed on the first side and the package assembly comprises:

a packaging substrate having a surface wherein the surface has a recess formed therein;

a first integrated circuit die disposed in the recess of the packaging substrate wherein the first integrated circuit die has a surface;

a spacer layer disposed on the surface of the first integrated circuit die wherein the spacer layer has a first surface proximate to the first integrated circuit die and a second surface opposite to the first surface, wherein the spacer layer is in the recess;

a dielectric layer disposed on the surface of the packaging substrate and on the second surface of the spacer layer; and a second integrated circuit die disposed on the dielectric layer.

6. The device of claim 5 wherein the packaging substrate is a coreless packaging substrate.

7. The device of claim 5 wherein the mainboard assembly has a second side, wherein the mainboard assembly has one or more additional devices disposed on the first or second side, and wherein the one or more additional devices are selected from the group consisting of processing devices, memory devices, signal processing devices, wireless communication devices, graphics controllers, input/output controllers, audio processors, power delivery components, and power management components.

* * * * *